US012581809B2

(12) United States Patent
Okamoto

(10) Patent No.: US 12,581,809 B2
(45) Date of Patent: Mar. 17, 2026

(54) DISPLAY DEVICE AND DISPLAY DEVICE PRODUCTION METHOD THAT PREVENTS DETERIORATION IN DISPLAY PERFORMANCE

(71) Applicant: SHARP KABUSHIKI KAISHA, Sakai City (JP)

(72) Inventor: Shota Okamoto, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 776 days.

(21) Appl. No.: 17/921,632

(22) PCT Filed: May 20, 2020

(86) PCT No.: PCT/JP2020/019901
§ 371 (c)(1),
(2) Date: Oct. 27, 2022

(87) PCT Pub. No.: WO2021/234843
PCT Pub. Date: Nov. 25, 2021

(65) Prior Publication Data
US 2023/0209924 A1 Jun. 29, 2023

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/131* (2023.02);
(Continued)

(58) Field of Classification Search
CPC ............. H10K 59/124; H10K 59/1201; H10K 59/131; H10K 59/873; H10K 59/88;
(Continued)

(56) References Cited

U.S. PATENT DOCUMENTS

2005/0134170 A1* 6/2005 Otani ............... H10K 59/80523
313/506
2015/0255743 A1* 9/2015 Mori .................... H10K 59/121
257/40

(Continued)

FOREIGN PATENT DOCUMENTS

JP 2010140790 * 6/2010
JP 2010140790 A 6/2010
(Continued)

*Primary Examiner* — Duy T Nguyen
*Assistant Examiner* — Pratiksha Jayant Lohakare
(74) *Attorney, Agent, or Firm* — ScienBiziP, P.C.

(57) ABSTRACT

A display device includes a base material, a thin film transistor provided on the base material, a light-emitting-element layer provided on the thin film transistor layer and including a plurality of light-emitting elements each including a first electrode, a functional layer, and a second electrode. The plurality of light-emitting elements are formed to emit lights in different colors. The display device also includes: a contact portion provided to a frame region and electrically connecting together a terminal unit provided to the frame region and the second electrode through a routed wire; and a block structure shaped into a frame and provided to the contact portion beside a display region, in order to block formation of the functional layer on the contact portion.

16 Claims, 16 Drawing Sheets

(51) Int. Cl.
    *H10K 59/131*      (2023.01)
    *H10K 59/80*       (2023.01)
    *H10K 59/88*       (2023.01)
(52) U.S. Cl.
    CPC ........... *H10K 59/873* (2023.02); *H10K 59/88*
                   (2023.02); *H10K 59/8731* (2023.02)
(58) Field of Classification Search
    CPC ......... H10K 59/8731; H10K 2102/331; H10K
                                   50/115; H10K 59/35
    USPC .......................................................... 257/40
    See application file for complete search history.

(56)                    References Cited

U.S. PATENT DOCUMENTS

2016/0155787 A1* 6/2016 Lee ...................... H10K 59/123
                                                   438/23
2018/0151647 A1* 5/2018 Lee .................. H10K 59/80522
2019/0320517 A1* 10/2019 Nakanishi .............. H05B 33/22
2019/0326549 A1* 10/2019 Kokame ................... G09F 9/30
2021/0020732 A1   1/2021 Watanabe et al.
2021/0036246 A1* 2/2021 Fujiwara .............. H10K 59/873

FOREIGN PATENT DOCUMENTS

JP        2012234748 A    11/2012
JP        2015170493 A     9/2015
WO        2019186900 A1   10/2019

* cited by examiner (a)

DISPLAY DEVICE AND DISPLAY DEVICE PRODUCTION METHOD THAT PREVENTS DETERIORATION IN DISPLAY PERFORMANCE

TECHNICAL FIELD

The disclosure relates to a display device and a display device production method.

BACKGROUND ART

Recent years have seen development and actual use of light-emitting display devices instead of non-light-emitting liquid crystal display devices. Such a display device that does not require aback light apparatus includes, for example, light-emitting elements such as organic light-emitting diodes (OLEDs) and quantum-dot light-emitting diodes (QLEDs) each provided for a pixel.

Moreover, the light-emitting display device described above includes: a first electrode; a second electrode; and a functional layer provided between the first electrode and the second electrode, and including at least a light-emitting layer. Furthermore, as to such a display device, a suggestion has been made to produce, for example, a high-definition display device at low cost with a simple manner. At least one layer included in the functional layer, namely, for example, the light-emitting layer, is formed not by known vapor deposition but by delivering droplets using spin coating and ink-jet printing (see, for example, Patent Document 1 below).

CITATION LIST

Patent Literature

Patent Document 1: Japanese Unexamined Patent Application Publication No. 2012-234748

SUMMARY

Technical Problem

As to the known display device described above and a method for producing the display device, for example, the second electrode is formed as a common layer in common among a plurality of light-emitting elements (a plurality of pixels). The second electrode is connected to a terminal unit through a contact portion and a routed wire provided out of the display region. The second electrode is further connected to an external power supply through the terminal unit. Hence, a predetermined voltage is applied to the second electrode.

However, as to the known display device described above and the method for producing the display device, if the functional layer is formed by delivering droplets, a functional-layer-forming solution to form the functional layer attaches to the contact portion. The attached solution could cause a poor electrical connection between the contact portion and the second electrode. As a result, the known display device and the method for producing the display device might cause a problem; that is, the resistance of the contact portion increases, such that light-emitting elements fail to emit light and light-emitting performance of the display device deteriorates.

In view of the above problem, an object of the disclosure is to provide a display device and a display device production method that can prevent the display performance from deteriorating even if the functional layer is formed by delivering droplets.

Solution to Problem

In order to achieve the above object, a display device according to the disclosure includes: a display region having a plurality of sub-pixels; and a frame region surrounding the display region. The display device includes:

a base material;

a thin-film transistor layer provided on the base material;

a light-emitting-element layer provided on the thin-film transistor layer, and including a plurality of light-emitting elements each including a first electrode, a functional layer, and a second electrode, the plurality of light-emitting elements being formed to emit lights in different colors;

a contact portion provided to the frame region, and electrically connecting together a terminal unit provided to the frame region and the second electrode through a routed wire; and a block structure shaped into a frame and provided to the contact portion beside the display region, in order to block formation of the functional layer on the contact portion.

In the above display device described above, the contact portion electrically connects the second electrode and the terminal unit together through the routed wire. Moreover, the block structure is shaped into a frame and provided to the contact portion beside the display region, in order to keep the functional layer from forming on the contact portion. Even if the functional layer is formed by delivering droplets, such features can keep the functional layer 24 from forming on the contact portion. As a result, the display device can prevent deterioration in display performance.

Moreover, a display device production method according to the disclosure is devised to produce a display device including: a display region having a plurality of sub-pixels; and a frame region surrounding the display region. The display device includes: a base material; a thin-film transistor layer provided on the base material; and a light-emitting-element layer provided on the thin film transistor layer, and including a plurality of light-emitting elements each including a first electrode, a functional layer, and a second electrode. The plurality of light-emitting elements are formed to emit lights in different colors. The display device production method includes:

a first electrode forming step of forming the first electrode;

a contact portion forming step of forming a contact portion in the frame region, the contact portion electrically connecting a terminal unit provided to the frame region and the second electrode together through a routed wire; and a block structure forming step of forming a block structure shaped into a frame and provided to the contact portion beside the display region, the block structure blocking formation of the functional layer on the contact portion.

In the display device production method described above, the first electrode forming step is carried out. After that, a contact portion forming step is carried out to form a contact portion in the frame region. The contact portion electrically connects the second electrode and the terminal unit together through the routed wire. Then, the block structure forming step is carried out to form the block structure shaped into a frame and provided to the contact portion beside the display region. The block structure blocks formation of the functional layer on the contact portion Even if the functional layer is formed by delivering droplets, such features can keep the functional layer 24 from forming on the contact portion. As a result, the display device can prevent deterioration in display performance.

Advantageous Effects of Disclosure

The disclosure can prevent display performance from deteriorating even if the functional layer is formed by delivering droplets.

BRIEF DESCRIPTION OF DRAWINGS

FIG. 10(*a*) is a perspective view of a specific configuration of a second electrode in the modification. FIG. 10(*b*) is a drawing illustrating a specific configuration of a light-emitting-element layer in the modification. FIG. 10(*c*) is a graph showing an advantageous effect of the modification.

FIG. 13 is a cross-sectional view of an essential configuration of a display device according to a fourth embodiment of the disclosure.

DESCRIPTION OF EMBODIMENTS

Embodiments of the disclosure will be described below in detail, with reference to the drawings. Note that the disclosure shall not be limited to the embodiments below. Moreover, in the description below, the term "same layer" means that constituent features are formed in the same process (in the same film forming process). The term "layer below"

means that a constituent feature is formed in a previous process before a comparative layer. The term "layer above" means that a constituent feature is formed in a successive process after a comparative layer. Furthermore, the dimensions of the constituent features in each of the drawings do not represent, for example, exact dimensions of the actual constituent features or exact dimensional proportions of the constituent features.

First Embodiment

Figure 1:
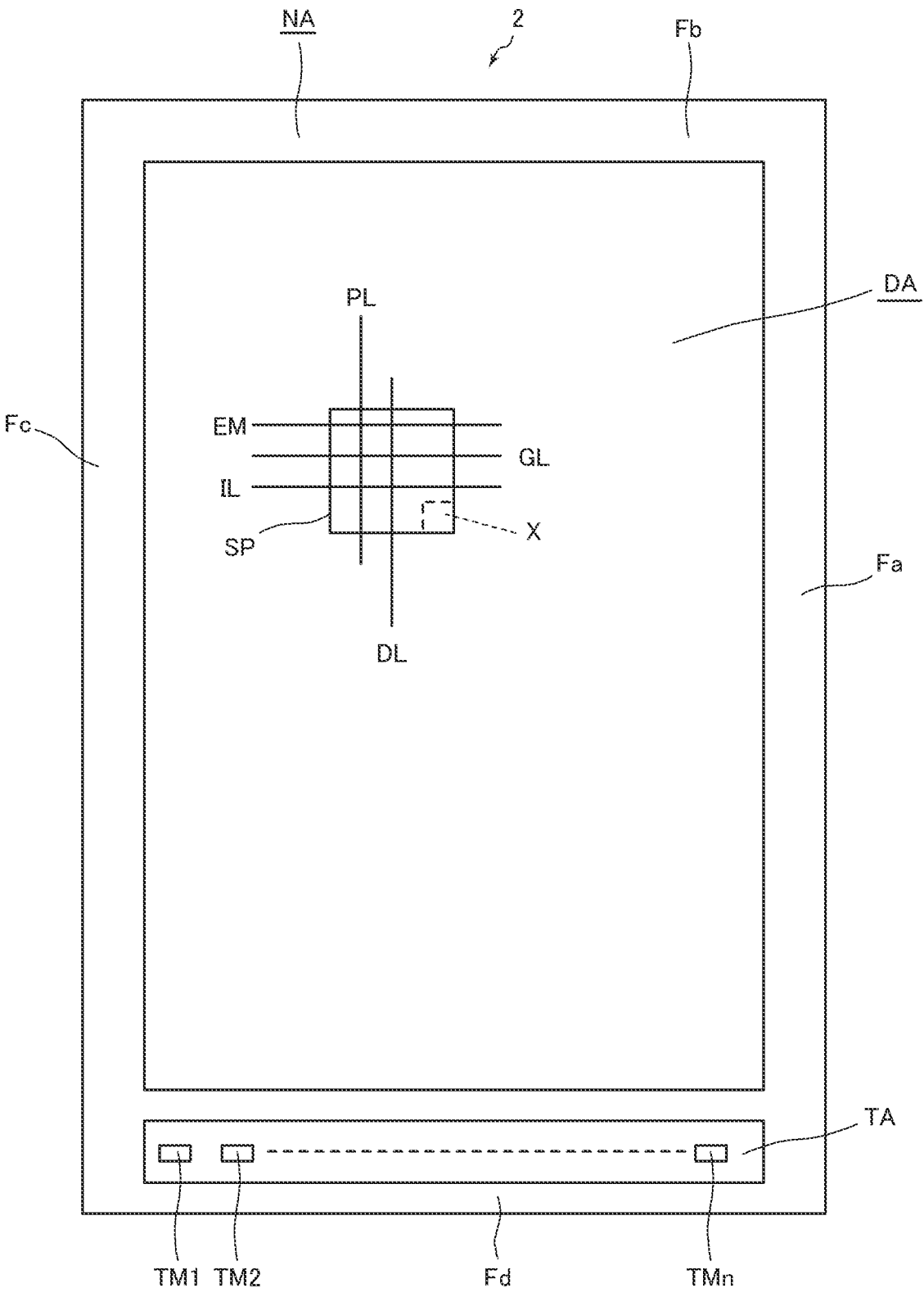
FIG. 1 is a schematic view of a configuration of a display device according to a first embodiment of the disclosure.
Figure 2:
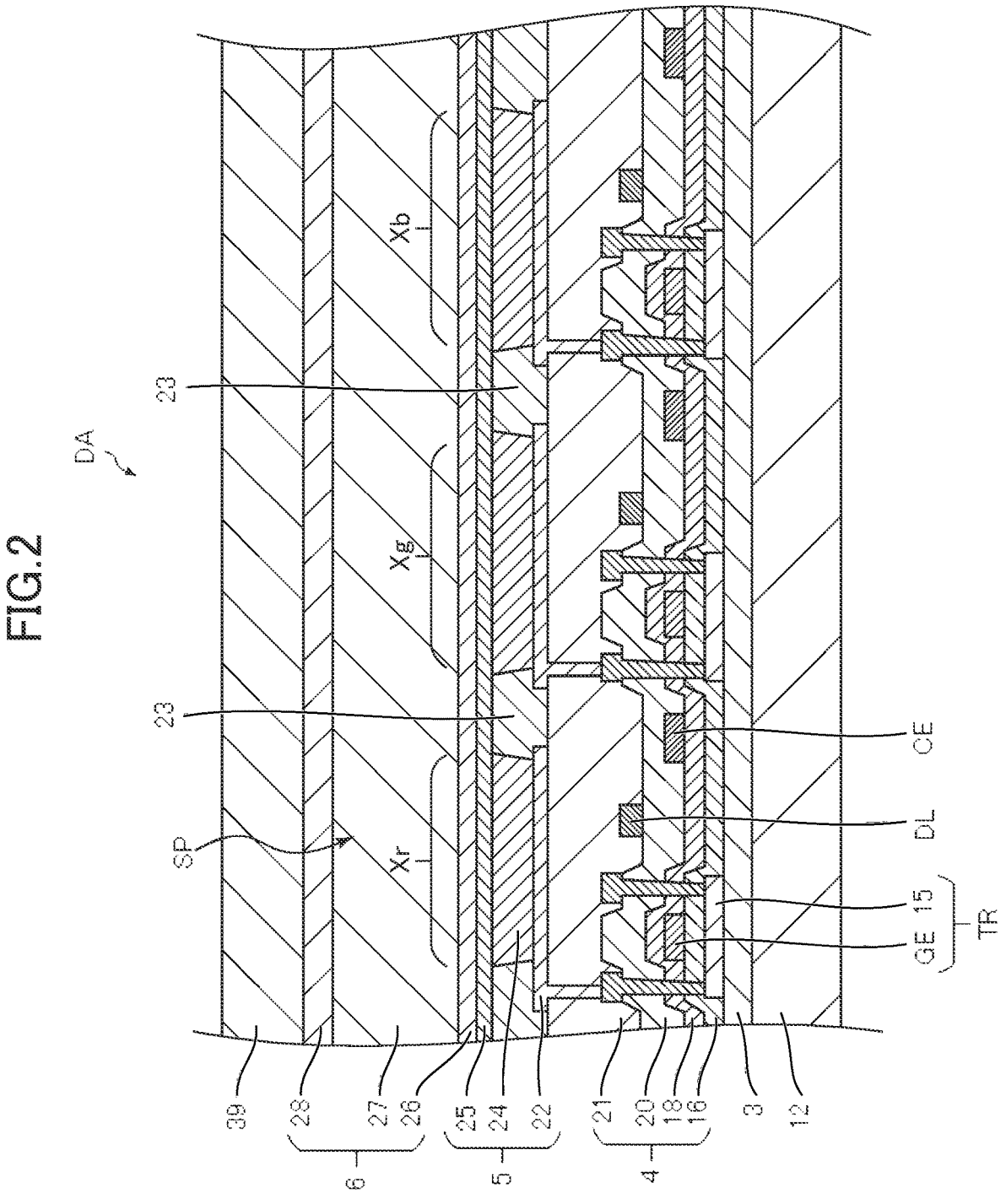
FIG. 2 is a cross-sectional view of an essential configuration of the display device illustrated in FIG. 1.
Figure 3:
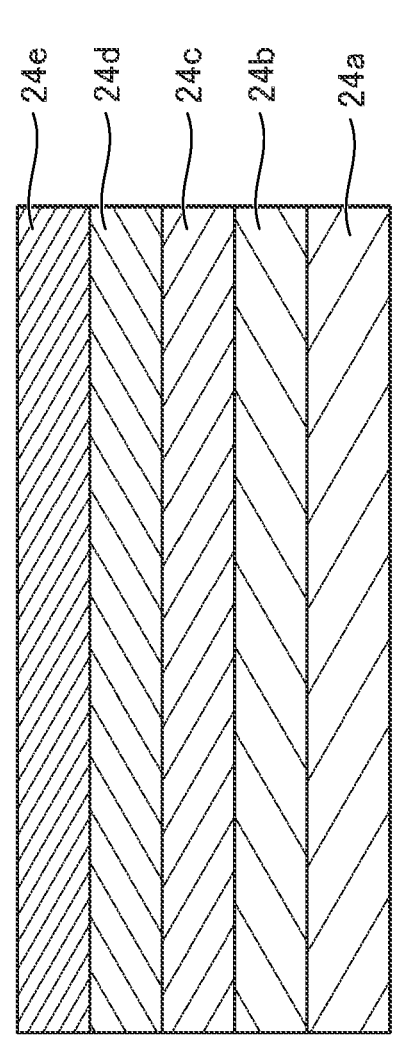
FIG. 3 is a cross-sectional view of a specific configuration of a functional layer illustrated in FIG. 2.
Figure 4:
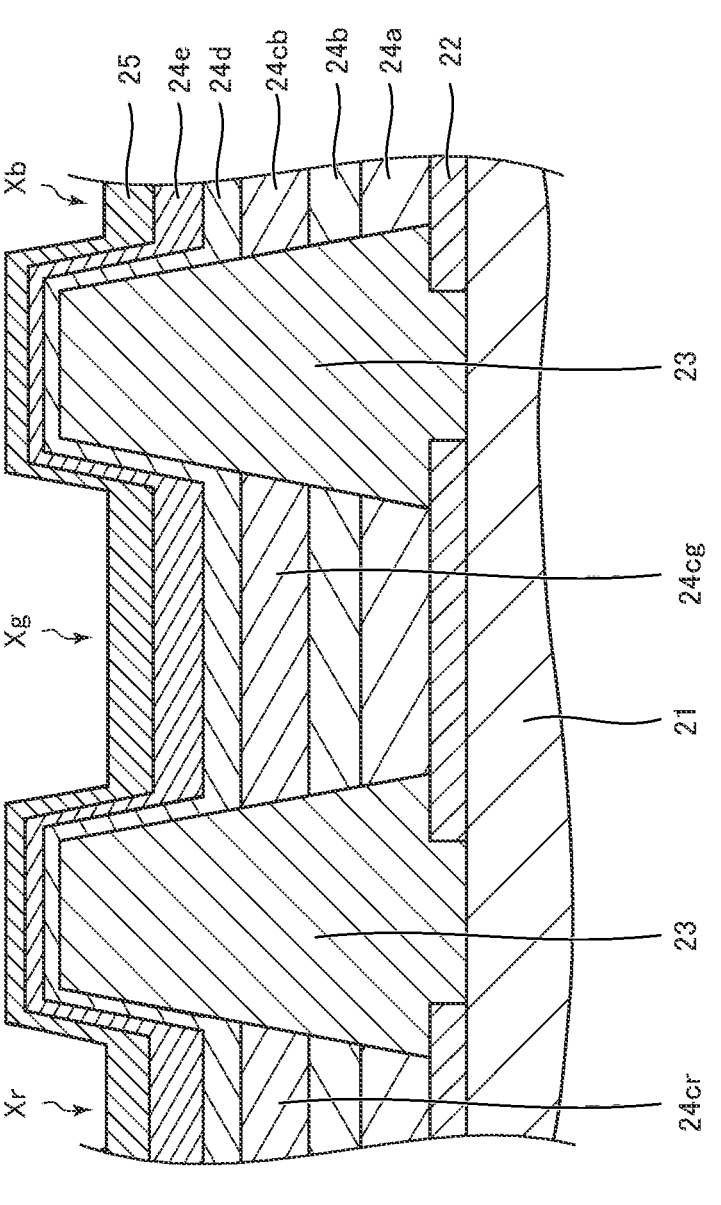
FIG. 4 is a cross-sectional view of a specific exemplary configuration of light-emitting elements illustrated in FIG. 2.

FIG. 1 is a schematic view of a configuration of a display device according to a first embodiment of the disclosure. FIG. 2 is a cross-sectional view of an essential configuration of the display device illustrated in FIG. 1. FIG. 3 is a cross-sectional view of a specific configuration of a functional layer illustrated in FIG. 2. FIG. 4 is a cross-sectional view of a specific exemplary configuration of light-emitting elements illustrated in FIG. 2.

As illustrated in FIGS. 1 and 2, a display device 2 according to this embodiment, includes: a barrier layer 3; a thin-film transistor (TFT) layer 4; a light-emitting-element layer 5 of a top-emission type; and a sealing layer 6, all of which are provided on a base material 12 in the stated order. A display region DA includes a plurality of sub-pixels SP. A frame region NA surrounding the display region DA has four edges Fa to Fd. On the edge Fd, a terminal unit TA is formed to mount an electronic circuit board (such as an IC chip and an FPC). The terminal unit TA includes a plurality of terminals TM1, TM2, and TMn (n is an integer of 2 or more). These plurality of terminals TM1, TM2, and TMn are provided along one of the four edges of the display region DA, as illustrated in FIG. 1. Note that, on each of the edges Fa to Fd, a driver circuit (not shown) can be formed.

The base material 12 may be either a glass substrate, or a flexible substrate including a resin film made of, for example, polyimide. Moreover, the base material 12 may be a flexible substrate made of two resin films and an inorganic insulating film sandwiched between these two resin films. Furthermore, to a lower surface of the base material 12, a film made of, for example, PET may be attached. In addition, if the base material 12 is a flexible substrate, the display device 2 to be formed can be a flexible one.

The barrier layer 3 keeps the thin-film layer 4 and the light-emitting-element layer 5 from such foreign objects as water and oxygen. The barrier layer 3 can be, for example, a silicon oxide film, a silicon nitride film, or a silicon oxide nitride film formed by chemical vapor deposition (CVD). Alternatively, the barrier layer 3 can be formed of a multilayer film including these films.

As illustrated in FIG. 2, the thin-film transistor layer 4 incudes: a semiconductor layer (including a semiconductor film 15) above the barrier layer 3; an inorganic insulating film 16 (a gate insulating film) above the semiconductor layer, a first metal layer (including a gate electrode GE) above the inorganic insulating film 16; an inorganic insulating film 18 above the first metal layer; a second Metal layer (including a capacitive electrode CE) above the inorganic insulating firm 18; an inorganic insulating film 20 above the second metal layer; a third metal layer (including a data signal line DL) above the inorganic insulating film 20; and a planarization film 21 above the third metal layer.

The above semiconductor layer is formed of, for example, amorphous silicon, low temperature polysilicon (LTPS), or oxide semiconductor. A thin-film transistor TR is formed to include the gate electrode GE and the semiconductor film 15.

Note that, in this embodiment, the thin-film transistor TR is, for example, a top-gate thin-film transistor. Alternatively, the thin-film transistor TR may be a bottom-gate thin-film transistor.

In the display region DA, a light-emitting element X and a control circuit of the light-emitting element X are provided for each of the sub-pixels SP. The thin-film layer 4 includes this control circuit and wires connecting to the control circuit. Examples of the wires to connect to the control circuit include: a scan signal line GL and a light-emission control line EM formed in the first metal layer; an initialization power supply line PL formed in the second metal layer; and a data signal line DL and a high-voltage power supply line PL formed in the third metal layer. The control circuit includes such transistors as a drive transistor to control a current of the light-emitting element X; a write transistor to electrically connect to the scan signal line; and a light-emission control transistor to electrically connect to the light-emission control line (not shown). Moreover, as will be described in more detail later, the display device 2 of this embodiment is provided with a block structure shaped into a frame to surround the display region DA. The block structure keeps the functional layer, included in the light-emitting-element layer 5, from forming on a contact portion provided outside the display region DA.

Each of the first metal layer, the second metal layer, and the third metal layer is a monolayer metal film made of at least one of such a metal as, for example, aluminum, tungsten, molybdenum, tantalum, chromium, titanium, or copper. Alternatively, each metal layer is a multilayer metal film formed of these metals.

Each of the inorganic insulating films 16, 18, and 20 can be, for example, a silicon oxide ($SiO_x$) film or a silicon nitride ($SiN_x$) film formed by the CVD. Alternatively, each of the inorganic insulating films 16, 18, and 20 can be a multilayer film including these films. The planarization film 21 can be made of, for example, an applicable organic material such as polyimide or acrylic resin.

The light-emitting-element layer 5 includes: a first electrode (an anode) 22 above the planarization film 21; an edge cover film 23 having insulating properties and covering art edge of the first electrode 22; a functional layer 24 above the edge cover film 23; and a second electrode (a cathode) 25 above the functional layer 24. That is, the light-emitting element layer 5 includes a plurality of the light-emitting elements X Each of the light-emitting elements X includes: the first electrode 22; a light-emitting layer included in the functional layer 24; and the second electrode 25. The light-emitting elements X emit lights in different colors. The light-emitting layer will be described later. The edge cover film 23 is formed of, for example, an organic material such as polyimide or acrylic resin. The organic material is applied, and after that, patterned by photolithography to form the edge cover film 23. Moreover, this edge cover film 23 overlaps with an edge portion of a surface of the first electrode 22 shaped into an island, and defines a pixel fa sub-pixel SP). The edge cover film 23 is a bank to separate the plurality of pixels (the sub-pixels SP) from each other for a corresponding one of the plurality of light-emitting-elements X. Furthermore, the functional layer 24 is an electroluminescence (EL) layer including an EL element.

In the light-emitting-element layer 5, the light-emitting-elements X include: a light-emitting element Xr (red); a light-emitting element Xg (green); and a light-emitting element Xb (blue) formed to emit lights in different colors. Moreover, each of the light-emitting elements X includes: the first electrode 22; the functional layer 24 (including the light-emitting layer), and the second electrode 25. The first electrode 22 is an electrode shaped into an island and provided for each of the light-emitting elements X (i.e. each of the sub-pixels SP). The second electrode 25 is a monolithic common electrode (a common layer) in common among all the light-emitting elements X.

The light-emitting elements Xr, Xg, and Xb may be either., for example, organic light-emitting diodes (OLEDs) so that the light-emitting layer to be described later is an organic light-emitting layer, or quantum-dot light-emitting diodes (QLEDs) so that the light-emitting layer is a quantum-dot light-emitting layer.

The functional layer 24 includes, for example: a hole-injection layer 24a; a hole-transport layer 24b; a light-emitting layer 24c, an electron-transport layer 24d; and an electron-injection layer 24e, all of which are stacked on top of another in the stated order from below. Moreover, the functional layer 24 may be provided with an electron-blocking layer and a hole-blocking layer. The light-emitting layer 24c is formed of droplets delivered and applied by such a technique as spin-coating or ink-jet printing. After that, the applied droplets are patterned to form the light-emitting layer 24c shaped into an island in an opening (for each of the sub-pixels SP) of the edge cover film 23. The other layers are each shaped into either islands or a monolithic form (a common layer), using the above delivery of droplets. Moreover, the functional layer 24 may omit one or more of the hole-injection layer 24a, the hole-transport layer 24b, the electron-transport layer 24d, and the electron-injection layer 24e.

The display device 2 of this embodiment, illustrated in FIG. 2 as an example, has a so-called-known structure including anodes (the first electrodes 22), the functional layers 24, and a cathode (the second electrode 25) provided in the stated order from toward the thin-film-transistor layer 4.

Moreover, as illustrated in FIG. 4, the display device 2 of this embodiment has the light-emitting elements Xr, Xg, and Xb separated from one another by the edge cover film 23 serving as a bank. For each of the light-emitting elements X, the first electrode 22, the hole-injection layer 24a, the hole-transport layer 24b, and light-emitting layers 24cr, 24eg, and 24cb (collectively referred to as the light-emitting layer 24c) are provided in shapes of islands. Furthermore, the light-emitting elements X are provided with the electron-transport layer 24d, the electron-injection layer 24e, and the second electrode 25, each of which is provided monolithically in common among ail the sub-pixels SP.

If an organic light-emitting layer (the light-emitting layer 24c) of an OLED is formed by vapor deposition, a fine metal mask (FMM) is used. The FMM is a sheet (made of, for example, invar) having many through holes. Organic material passing through one through hole forms a light-emitting layer (corresponding to one sub-pixel) shaped into an island Otherwise, the organic light-emitting layer (the light-emitting layer 24c) of an OLED may be formed of a predetermined solution delivered in droplets.

If each of the light-emitting elements Xr, Xg and Xb is an OLED, holes and electrons recombine together in the light-emitting layer 24c by a drive current between the first electrode 22 and the cathode 25, which forms an exciton. While the exciton transforms to the ground state, light is released. Because the second electrode 25 is highly light-transparent and the first electrode 22 is light-reflective, the light released from the functional layer 24 travels upwards. This is how the light-emitting-element layer 5 is of atop emission type.

A quantum-dot light-emitting layer (the light-emitting layer 24c) of a QLED is formed of, for example, a solution containing a solvent and quantum dots dispersed in the solvent. The solution is applied and then patterned by photolithography to form a light-emitting layer (corresponding to one sub-pixel) shaped into an island.

Moreover, if each of the light-emitting elements Xr, Xg, and Xb is a QLED, holes and electrons recombine together in the light-emitting layer 24c by a drive current between the first electrode 22 and the second electrode 25, which forms an exciton. While the exciton transforms from the conduction band level to the valence band level of the quantum dots, light (fluorescence) is released.

The light-emitting-element layer 5 may include a light-emitting element such as, for example, an inorganic light-emitting diode other than the OLED and the QLED.

Furthermore, described below is an example in which the light-emitting layer 24c is a quantum-dot light-emitting layer containing quantum dots. That is, in the display device 2 of this embodiment, the light-emitting element Xr in red includes a red quantum-dot light-emitting layer that emits a red light, the light-emitting element Xg in green includes a green quantum-dot light-emitting layer that emits a green light, and the light-emitting element Xb in blue includes a blue quantum-dot light-emitting layer that emits a blue light.

The quantum-dot light-emitting layer (the light-emitting layer 24c) contains quantum dots serving as a functional material contributing to a function of the light-emitting layer 24c. The light-emitting layers 24cr, 24cg, and 24cb in respective colors contain quantum dots in at least different particle sizes, depending on emission spectra of the light-emitting layers 24cr, 24cg, and 24cb.

The first electrode (the anode) 22 is a light-reflective multilayer made of, for example, indium tin oxide (ITO), indium zinc oxide (IZO), and one of silver (Ag), Al, or an alloy containing Ag and Al The second electrode (the cathode) 25 is a transparent electrode formed of such a light-transparent conductive material as, for example: a thin film made of Ag, Au, Pt, Ni, Ir, or Al; a thin film made of a MgAg alloy; ITO; or indium zinc oxide (IZO). Note that, otherwise, the second electrode 25 may be metal nanowires formed of such a metal as, for example, silver. If such metal nanowires are used to form the second electrode 25, which is a common electrode shaped monolithically and provided upwards, a solution containing the metal nanowires can be applied to form the second electrode 25. As a result, as to the light-emitting-element layer 5 of the display device 2, a predetermined solution to be delivered in droplets can be used to form, other than the first electrode 22, each of the layers in the functional layer 24 and the second electrode 25. Hence, the display device 2 can be produced in a simple manner.

The sealing layer 6, which is light-transparent, includes, an inorganic sealing film 26 directly formed on the second electrode 25 (formed in contact with the second electrode 25); an organic film 27 above the inorganic sealing film 26, and an inorganic sealing film 28 above the organic film 27. The sealing layer 6 covers the light-emitting-element layer 5 to keep such foreign objects as water and oxygen from penetrating into the light-emitting element layer 5. Note that, if the light-emitting layer 24c is a quantum-dot light-emitting layer, the sealing layer 6 can be omitted.

The organic film 27, which is transparent to light, has a planarization effect. The organic film 27 can be formed of an applicable organic material by, for example, ink-jet printing The inorganic sealing films 26 and 28 are inorganic insulating films. Each of the inorganic sealing films 26 and 28 can be, for example, a silicon oxide film, a silicon nitride film, or a silicon oxide nitride film formed by the CVD. Alternatively, each of the inorganic sealing films 26 and 28 can be formed of a multilayer film including these films.

The functional film 39 has at least one of, for example, an adaptive optics correction function, a touch sensor function, and a protection function.

Figure 5:
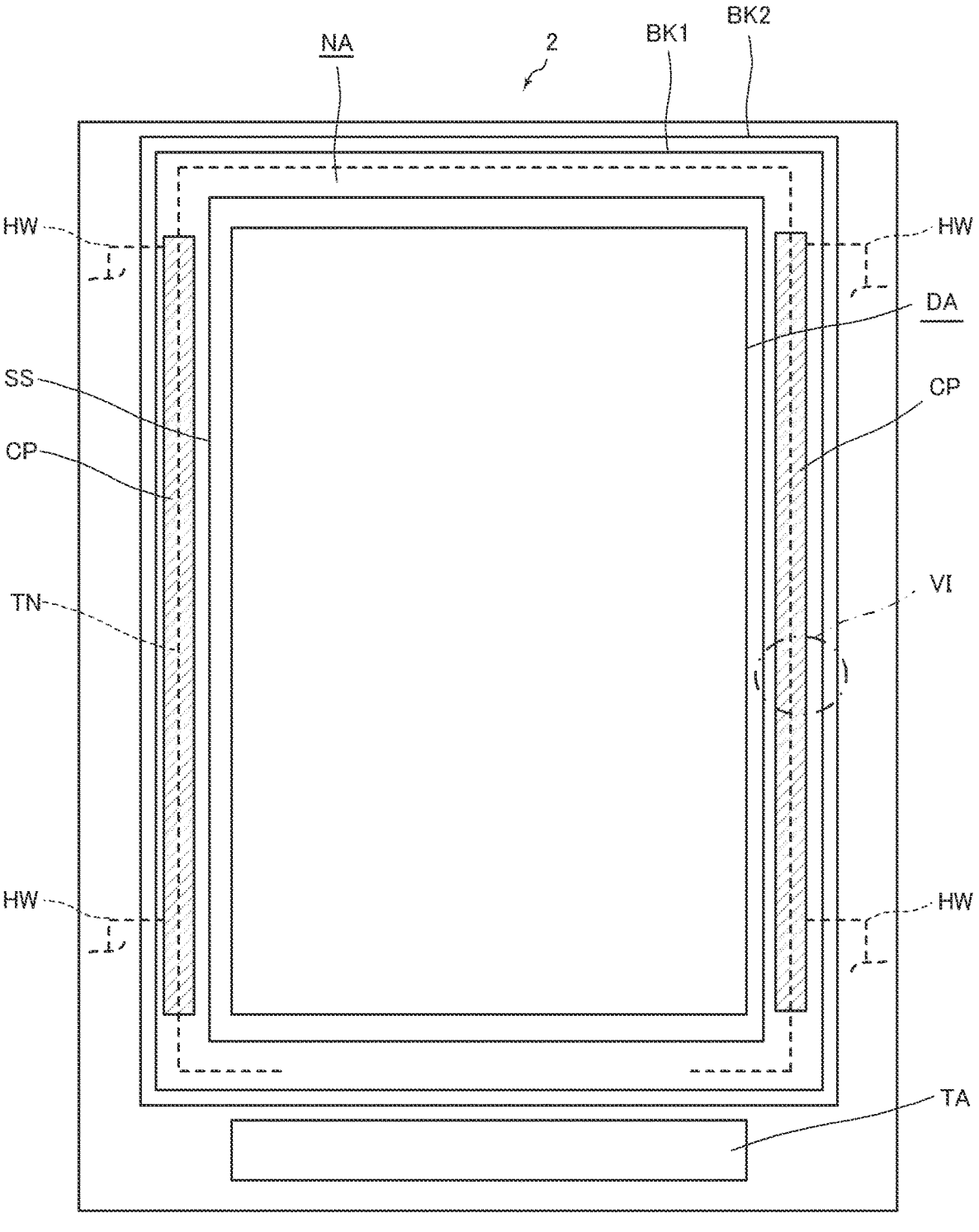
FIG. 5 is a drawing illustrating a relationship between a contact portion and a block structure in the above display device.
Figure 6:
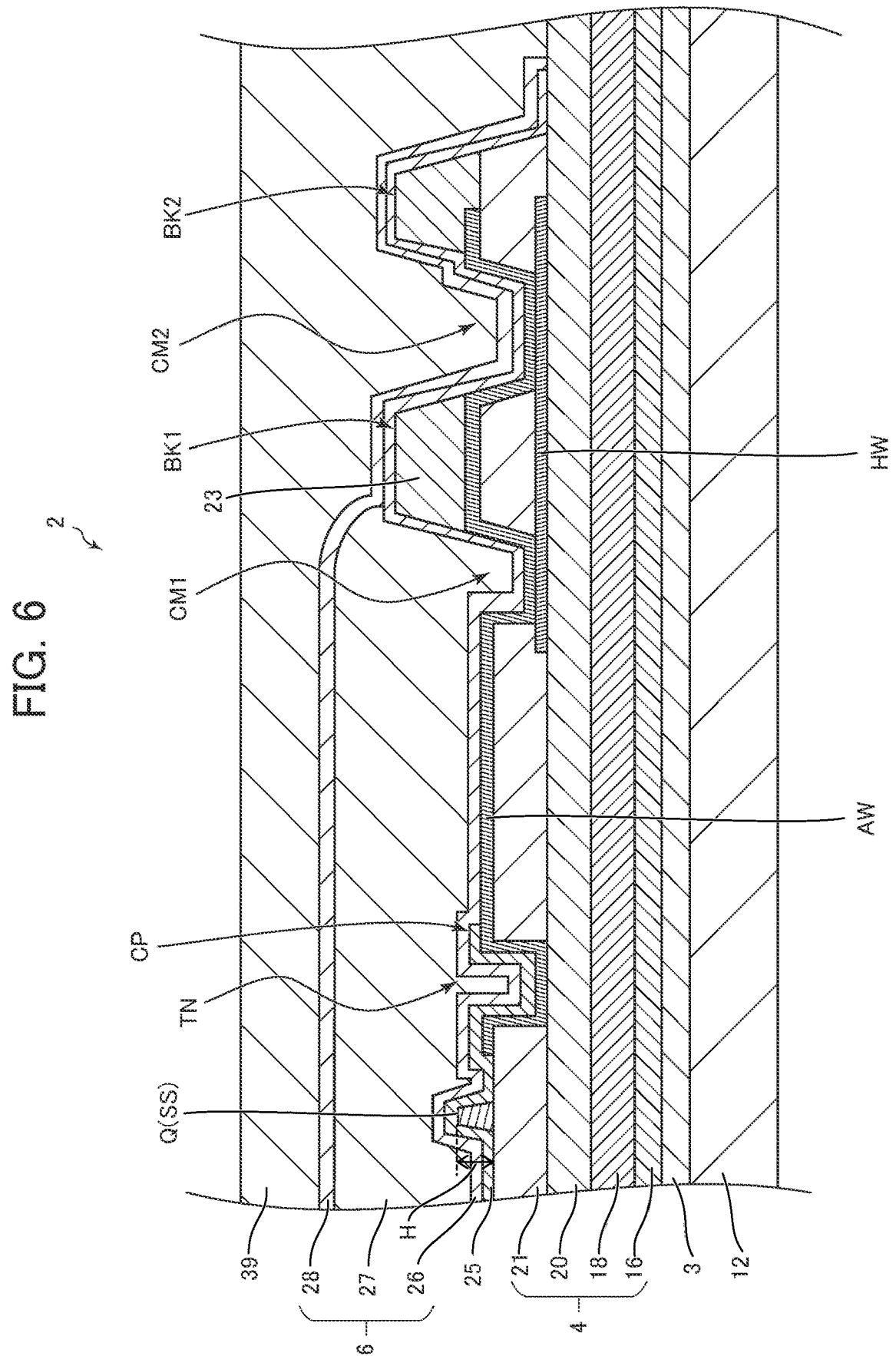
FIG. 6 is a cross-sectional view of a configuration circled by the VI line in FIG. 5.

Here, also with reference to FIGS. 5 and 6, an essential portion of the display device 2 of this embodiment is specifically described. FIG. 5 is a drawing illustrating a relationship between the contact portion and the block structure in the above display device FIG. 6 is a cross-sectional view of a configuration circled by the VI line in FIG. 5.

In the display device 2 of this embodiment, the hatching in FIG. 5 exemplifies two contact portions CP shaped into rectangles and provided to the frame region NA across the display region DA from each other. As shown in FIG. 6, each of the contact portions CP is provided with a conductive film AW electrically connecting to the second electrode 25. Moreover, this conductive film AW electrically connects to one end of a routed wire HW whose another end is connected to the terminal unit TA. Furthermore, this conductive film AW is formed, for example, in the same layer as, and of the same material as, the first electrode 22. Such a feature simplifies a production step of the display device 2. In addition, the routed wire HW is formed, for example, in the same layer as, and of the same material as, the data signal line DL (the third metal layer). Such a feature simplifies the production step of the display device 2.

Moreover, in the display device 2 in FIG. 5 of this embodiment, the frame region NA is provided with a block structure SS to surround the display region DA. Furthermore, as the dotted line in FIG. 5 shows, the frame region NA is provided with a trench TN shaped into a substantial U-shape outside (across from) the block structure SS. Specifically, as illustrated in FIG. 6, the thin-film transistor layer 4 includes the planarization film 21 formed as an uppermost layer of the thin-film transistor layer 4 The trench TN is a cutout formed in the planarization film 21 to surround the block structure SS In addition, as illustrated in FIG. 5, the frame region NA is provided with sealing banks BK1 and BK2 each shaped into a frame outside the trench TN. These sealing banks BK1 and BK2 define an end portion of the organic film 27 in the sealing layer 6.

Moreover, as illustrated in FIG. 6, the block structure SS of this embodiment includes a bank Q protruding from the thin-film transistor layer 4. This bank Q has a height H determined in accordance with a volume of the functional layer 24 formed by delivering droplets, such as spin-coating. Hence, even if a functional-layer-forming solution to form the functional layer 24 is delivered in the form of droplets to a center portion of the display device 2, and after that, the functional-layer-forming solution is spread and applied to the whole surface of the display region DA by, for example, spin-coating, the bank Q can keep the functional-layer-forming solution from spreading outside the display region DA and prevent application of the solution to the contact portion CP.

Moreover, as exemplified in FIG. 6, each of the sealing banks BK1 and BK2 includes: a portion formed in the same layer as, and of the same material as, the planarization film 21; and another portion stacked over the portion and formed in the same layer as, and of the same material as, the edge cover film 23. Note that, otherwise, the sealing banks BK1 and BK2 may be formed in the same layer as, and of the same material as, either the planarization film 21 or the edge cover film 23. Furthermore, the sealing bank BK1 is a liquid-blocking structure to block droplets in forming the organic film 27, and the sealing bank 2 is a backup to stop the droplets running over the sealing bank BK1.

In addition, as exemplified in FIG. 6, the conductive film AW extends in the frame region NA to lie across the trench TN and overlap with the sealing bank BK2 provided outwards. Moreover, behind the sealing bank BK1, a contact groove CM1 is formed to penetrate the planarization film 21 and the edge cover film 23. Furthermore, between the sealing bank BK1 and the sealing bank BK2, a contact groove CM2 is formed to penetrate the planarization film 21 and the edge cover film 23. Then, in these contact grooves CM1 and CM2, the routed wire HW is exposed in contact with the conductive film AW. Hence, the routed wire HW and the conductive film AW are electrically connected together. In addition, this routed wire HW is connected to a cathode power supply voltage (ELVSS) through the terminal unit TA so that the cathode power supply voltage is supplied from the routed wire HW through the conductive film AW to the second electrode 25.

Figure 7:
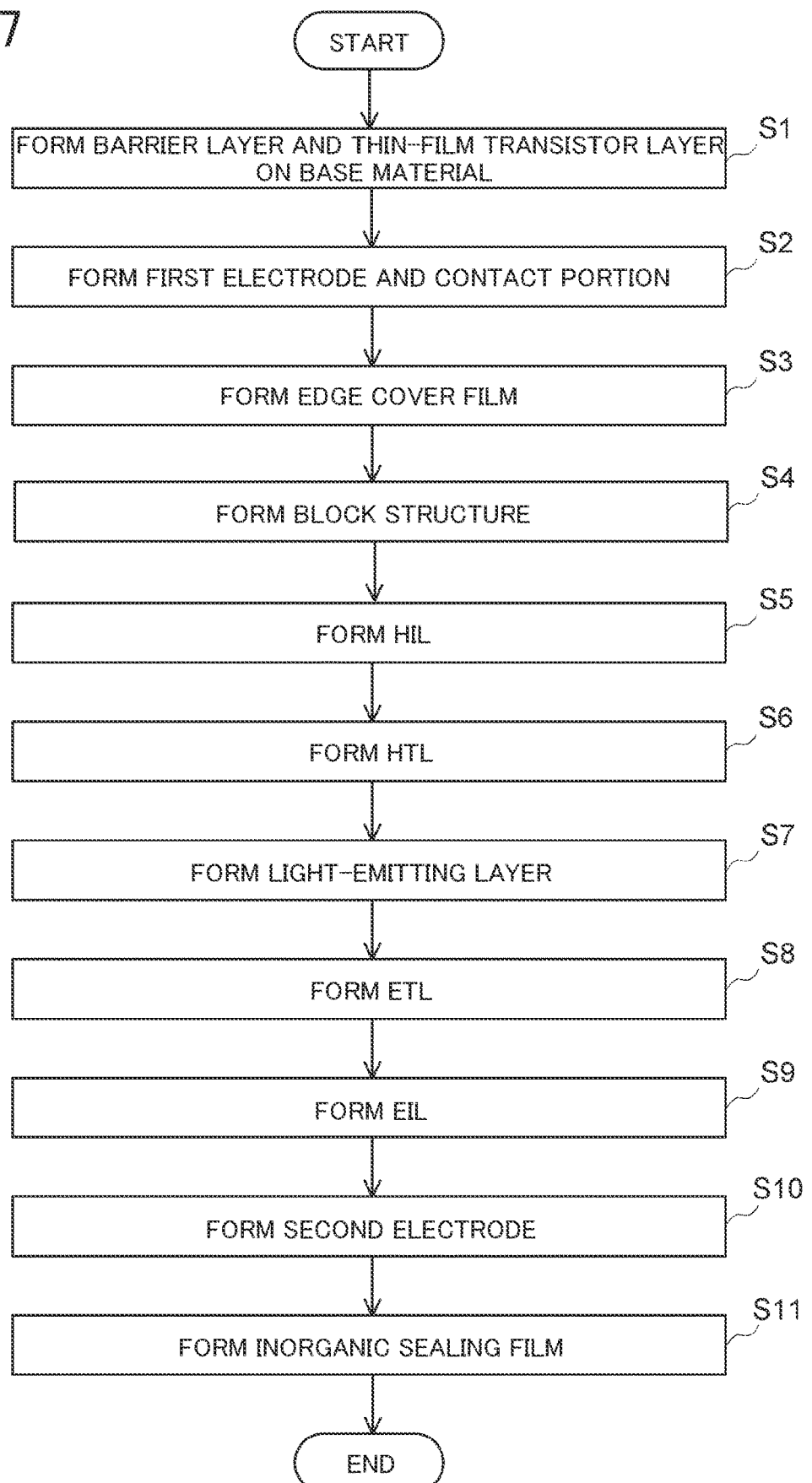
FIG. 7 is a flowchart showing a method for producing the display device.

Next, also with reference to FIG. 7, a method for producing the display device 2 of this embodiment is specifically described. FIG. 7 is a flowchart showing a method for producing the display device.

As illustrated in FIG. 7, in the method for producing the display device 2 of this embodiment, first, the barrier layer 3 and the thin-film transistor layer 4 are formed on the base material 12 (Step S1). Next, for example, using sputtering and photolithography, the first electrode (the anode) 22 and the contact portion CP are formed on the planarization film 21 (Step S2). That is, in a first electrode forming step, the first electrode 22 is formed. In a contact portion forming step, the contact portion CP is formed in the frame region NA to electrically connect together the terminal unit TA provided to the frame region NA and the second electrode 25 through the routed wire HW. The first electrode forming step and the contact portion forming step are carried out simultaneously. Specifically, the first electrode 22 and the conductive film AW that is formed in the same layer as, and of the same material as, the first electrode 22, are formed simultaneously. Hence, the first electrode 22 and the contact portion CP are provided simultaneously for each of the light-emitting elements X. Then, the edge cover film 23 is formed (Step S3).

After that a block structure forming step is carried out to form the block structure SS shaped into a frame and provided to the contact portion CP beside the display region DA, in order to block formation of the functional layer 24 on the contact portion CP. In this embodiment, the bank Q protruding from the thin-firm transistor layer 4 is formed as the block structure SS (Step S4). Moreover, in this embodiment, the bank Q is formed, for example, in the same layer as, and of the same material as, the edge cover film 23. Step S3 and Step S4 can be carried out simultaneously.

Next, the hole-injection layer (the HIL) 24a is formed of droplets delivered by such a technique as ink-jet printing (Step S5). Specifically, in this hole-injection-layer forming step, examples of a solvent contained in the hole-injection-layer forming solution include, ethanol; 2-propanol; ethylene glycol; polyethylene glycol; butyl benzoate; toluene; chlorobenzene; tetrahydrofuran; 1,4-dioxane; and diethyl sulfide. Moreover, a substance; that is, a hole-injection material (a functional material), dissolved in the hole-injection-layer forming solution is, for example: a polythiophene-based conductive material such as PEDOT:PSS; or an inorganic compound such as nickel oxide, tungsten oxide, or copper thiocyanate. Then, in this HIL forming step, the hole-injection-layer forming solution, which is delivered in the form of droplets on the first electrode 22, is baked at a predetermined temperature, so that the hole-injection layer 24a is formed to have a thickness of, for example, 20 to 50 nm.

Note that, if the light-emitting elements Xr, Xg, and Xb are OLEDs, examples of the hole-injection material (the functional material) for the hole-injection-layer forming solution, in addition to the above materials, include: benzene, styrylamine, triphenylamine, porphyrin, triazole, imidazole, oxadiazole, polyaryl alkane, phenylenediamine, allylamine, oxazole, anthracene, fluorenone, hydrazone, stilbene, triphenylene, and azatriphenylene, a derivative of these materials, and a chain-conjugated organic polymer such as a polysilane-based compound, a vinylcarbazole-based compound, a thiophene-based compound, and an aniline-based compound. Moreover, the solvent of the hole-injection-layer forming solution for the OLEDs may be the same as the solvent of that for the QLEDs.

Next, the hole-transport layer (the HTL) 24b is formed of droplets delivered by such a technique as ink-jet printing (Step S6). Specifically, in this hole-transport-layer forming step, examples of a solvent contained in the hole-transport-layer forming solution include: chlorobenzene, toluene; tetrahydrofuran; 1,4-dioxane; and phenylcyclohexane. Moreover, a substance; that is, a hole-transport material (a functional material), dissolved in the hole-transport-layer forming solution is, for example: an organic polymeric compound such, as TBF, PVK; or poly-TPD; or an inorganic compound such as nickel oxide. Then, in this HTL forming step, the hole-transport-layer forming solution, which is delivered in the form of droplets on the hole-injection layer 24a, is baked at a predetermined temperature, so that the hole-transport layer 24b is formed to have a thickness of, for example, 20 to 50 nm.

Note that, if the light-emitting elements Xr, Xg, and Xb are OLEDs, examples of the hole-transport material (the functional material) for the hole-transport-layer forming solution, in addition to the above materials, include: benzene, styrylamine, triphenylamine, porphyrin, triazole, imidazole, oxadiazole, polyaryl alkane, phenylenediamine, allylamine, oxazole, anthracene, fluorenone, hydrazone, stilbene, triphenylene, and azatriphenylene; a derivative of these materials; and a chain-conjugated organic polymer such as a polysilane-based compound, a vinylcarbazole-based compound, a thiophene-based compound, and an aniline-based compound. Moreover, the solvent of the hole-transport-layer forming solution for the OLEDs may be the same as the solvent of that for the QLEDs.

Next, the light-emitting layer (the HIL) 24c is formed of droplets delivered by such a technique as ink-jet printing (Step S7). Specifically, in this light-emitting-layer forming step, examples of a solvent contained in the light-emitting-layer forming solution include, toluene; propylene glycol methyl ether acetate (PGMEA); and cyclododecane. Moreover, a dissolved substance; that is, a light-emitting material (a functional material) is quantum dots containing, for example, C, Si, Ge, Sn, P, Se, Te, Cd, Zn, Mg, S, In, or O. Furthermore, as described above, this light-emitting-layer forming solvent contains: a polymeric resin material containing an oxetane-based monomer and an epoxy-based monomer; and a polymerization initiator.

Note that, if the light-emitting elements Xr, Xg, and Xb are OLEDs, examples of the light-emitting material (the functional material) for the light-emitting-layer forming solution include such organic light-emitting materials as:

anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, or stilbene; a derivative of these materials; a tris(dibenzoylmethyl) phenanthroline europium complex; and ditolylvinylbiphenyl, in addition to the quantum dots containing, for example, C, Si, Ge, Sn, P, Se, Te, Cd, Zn, Mg, S, In, or O, or the organic compound described above. Moreover, the solvent of the light-emitting-layer forming solution, the polymeric resin material, and the polymerization initiator for the OLEDs may be the same as those for the QLEDs.

Next, the electron-transport layer (the ETL) $24d$ is formed of droplets delivered by such a technique as ink-jet printing or spin-coating (Step S8). Specifically, in this electron-transport-layer forming step, examples of a solvent for the electron-transport-layer forming solution include: 2-propanol; ethanol; ethylene glycol; polyethylene glycol; toluene; chlorobenzene; tetrahydrofuran; and 1,4-dioxane. Moreover, a dissolved substance; that is, an electron-transporting material (a functional material) is nanoparticles of, for example, zinc oxide (ZnO) or magnesium zinc oxide (MgZnO).

Note that, if the light-emitting elements Xr, Xg, and Xb are OLEDs, examples of the electron-transporting material (the functional material) for the electron-transport-layer forming solution include: quinolone, perylene, phenanthroline, bistyryl, pyrazine, triazole, oxazole, oxadiazole, fluorenone; a derivative of these materials; and such metal complexes as, specifically, 3,3'-bis(9H-carbazol-9-yl)biphenyl (mCBP), 1,3,5-tris(N-phenylbenzimidazol-2-yl (benzene (TPBI). 3-phenyl-4(1'-naphthyl)-5-phenyl-1,2,4-triazole (TAZ), 1,10-phenanthroline, and alq(tris(8-hydroxyquinoline)aluminium, in addition to the nanoparticles of zinc oxide (ZnO) and magnesium zinc oxide (MgZnO) described above. Moreover, the solvent of the electron-transport-layer forming solution for the OLEDs may be the same as the solvent of that for the QLEDs.

Next, the electron-injection layer (the EIL) $24e$ is formed of droplets delivered by such a technique as ink-jet printing or spin-coating (Step S9). Specifically, in this electron-injection-layer forming step, examples of a solvent for the electron-injection-layer forming solution include: 2-propanol, ethanol; ethylene glycol; polyethylene glycol; toluene; chlorobenzene; tetrahydrofuran; and 1,4-dioxane. Moreover, a dissolved substance; that is, an electron-injection material (a functional material) is nanoparticles of, for example, zinc oxide (ZnO) or magnesium zinc oxide (MgZnO). Furthermore, an example of an additive material includes, similar to the hole-injection-layer forming solution, an organic salt selected from a group consisting of: quaternary ammonium salt; lithium tetrafluoroborate salt, and lithium hexafluorophosphate salt.

Note that, if the light-emitting elements Xr, Xg, and Xb are OLEDs, examples of the electron-injecting material (the functional material) for the electron-injection-layer forming solution include: quinolone, perylene, phenanthroline, bistyryl, pyrazine, triazole, oxazole, oxadiazole, fluorenone, a derivative of these materials, and such metal complexes as, specifically, 3,3'-bis(9H-carbazol-9-yl)biphenyl (mCBP), 1,3,5-tris(N-phenylbenzimidazol-2-yl)benzene (TPBI), 3-phenyl-4(1'-naphthyl)-5-phenyl-1,2,4-triazole (TAZ), 1,10-phenanthroline, and alq(tris(8-hydroxyquinoline)aluminium, in addition to the nanoparticles of zinc oxide (ZnO) and magnesium zinc oxide (MgZnO) described above. Moreover, the solvent of the electron-injection-layer forming solution for the OLEDs may be the same as the solvent of that for the QLEDs.

Then, on the electron-injection layer $24e$, a metal thin film made of such a metal as aluminum or silver is formed as the second electrode (the cathode) 25, using by, for example, vapor deposition or sputtering (Step S10).

After that, the inorganic sealing film 26 is formed to cover the second electrode 25. Then, on the inorganic sealing film 26, a material (a precursor) of the organic film 27 is applied by ink-jet printing. The material cures to form the organic film 27. Moreover, the inorganic sealing film 28 is formed above the organic film 27 (Step S11) As a result, as illustrated in FIG. 2, the display device 2 including the RGB light-emitting elements Xr, Xg, and Xb are produced.

Thus, the display device 2 can be produced as described above.

In the above display device 2 of this embodiment, the contact portion CP electrically connects the second electrode 25 and the terminal unit TA together through the routed wire HW. Moreover, the bank Q serving as the block structure SS is shaped into a frame and provided to the contact portion CP beside the display region DA, in order to keep the functional layer from forming on the contact portion CP. Hence, as to the display device 2 of this embodiment, even if the functional layer 24 is formed by delivering droplets, the above features can prevent application of the functional-layer-forming solution for forming the functional layer 24 to the contact portion CP, and keep the functional layer 24 from forming on the contact portion CP. As a result, unlike-known examples, this embodiment can prevent an increase in the resistance of the contact portion CP, making it possible to prevent deterioration in display performance of the display device 2.

Modification

Figure 8:
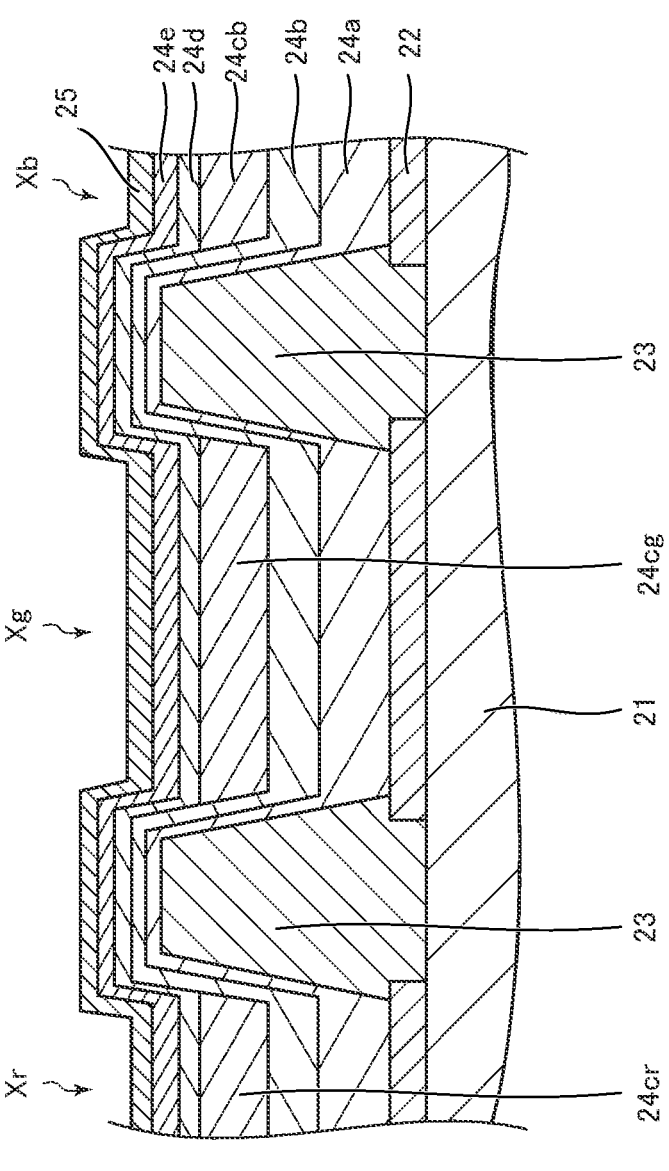
FIG. 8 is a cross-sectional view of a modification of the display device.

FIG. 8 is a cross-sectional view of a modification of the display device.

In the drawing, a main difference between this modification and the first embodiment is that, in the modification, the hole-injection layer $24a$ and the hole-transport layer $24b$ are provided as common layers in common among all the sub-pixels. Note that like reference signs denote common constituent features between this modification and the first embodiment. Such constituent features will not be elaborated upon here.

In the display device 2 of this modification, as illustrated in FIG. 8, the hole-injection layer $24a$ and the hole-transport layer $24b$ are formed monolithically in common among the light-emitting elements Xr, Xg, and Xb. That is, each of the hole-injection layer $24a$ and the hole-transport layer $24b$ can be formed not only by the ink-jet printing described in the first embodiment, but also by delivering droplets such as spin-coating.

As can be seen, this modification can achieve similar advantageous effects as those of the first embodiment. Moreover, the hole-injection layer $24a$ and the hole-transport layer $24b$ are formed as common layers, such that the production step of the display device 2 can be simplified.

Second Embodiment

Figure 9:
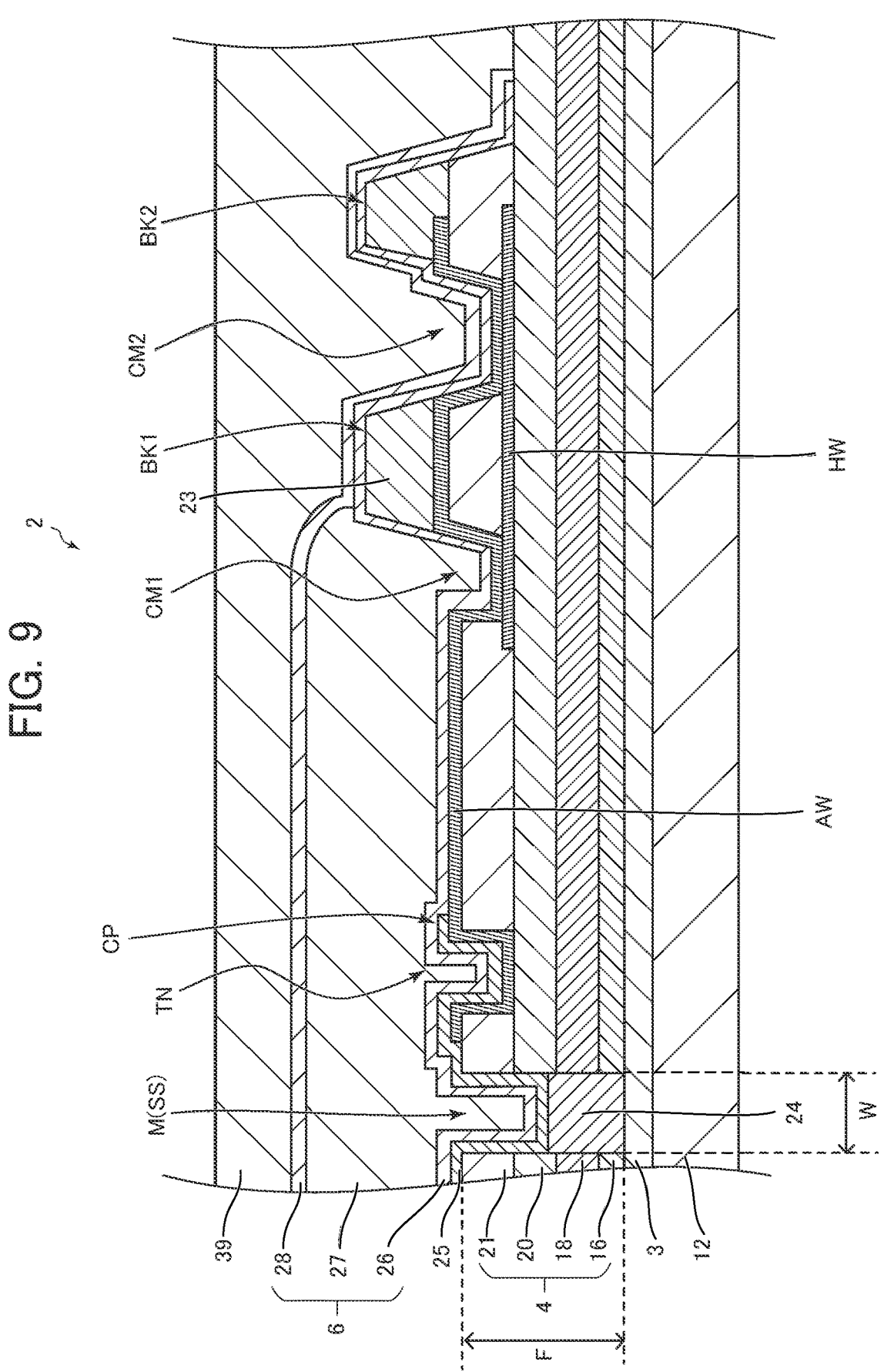
FIG. 9 is a cross-sectional view of an essential configuration of a display device according to a second embodiment of the disclosure.

FIG. 9 is a cross-sectional view of an essential configuration of a display device according to a second embodiment of the disclosure. A main difference between this embodiment and the first embodiment is that the thin film transistor layer is provided with a groove serving as the block structure. Note that like reference signs denote common constituent features between this embodiment and the first embodiment. Such constituent features will not be elaborated upon here.

FIG. 9 shows that, in the display device 2 of this embodiment, a groove M serving as the block structure SS is provided to the thin-film transistor layer 4. Specifically, the thin-film transistor layer 4 includes: a plurality of the inorganic insulating films 16, 18, and 20, and the planarization film 21, all of which are sequentially stacked one another from toward the base material 12. Then, the groove M is, for example, etched as a cutout in the planarization film 21 and the plurality of inorganic insulating films 16, 18, and 20, and formed to expose the barrier layer 3. Note that, otherwise, the groove M may be a cutout in the planarization film 21, the plurality of inorganic insulating films 16, 18, and 20, and the barrier layer 3, and formed to expose the base material 12.

Moreover, the groove M has a volume determined in accordance with a volume of the functional layer 24 formed by delivering droplets, such as spin-coating. Specifically, a value of the volume of the groove M can be obtained as follows, a value of the cross-section of the groove M, which is the product of a depth "F" (i.e. a distance between the upper surface of the barrier layer 3 and the upper surface of the planarization film 21) and a width "W" in FIG. 9, is multiplied by a value of the sum of the four sides of the block structure SS shaped into a rectangle in FIG. 5. Hence, even if a functional-layer-forming solution to form the functional layer 24 is delivered in the form of droplets to a center portion of the display device 2, and alter that, the functional-layer-forming solution is spread and applied to the whole surface of the display region DA by, for example, spin-coating, the groove M can accumulate therein the functional-layer-forming solution as the functional layer 24. As a result, in this embodiment, the groove M can keep the functional-layer-forming solution from spreading outside the display region DA and prevent application of the solution to the contact portion CP. Note that the depth F of the groove M is, for example, preferably 500 μm or more, and more preferably, from 1,000 to 3,000 μm. Moreover, the width of the groove M is, for example, preferably 500 μm or more, and more preferably, from 1,000 to 1,500 μm.

Moreover, in a method for producing the display device 2 according to this embodiment, the forming step of the edge cover film at Step S3 in FIG. 7 is carried out. After that, in the block-structure forming step at Step S4 in FIG. 7, the groove M is cut out of the thin-film transistor layer 4 to form the block structure SS. Note that this embodiment shall not be limited to the above method. For example, an insulating layer made of an insulating material is formed on the base material 12, and the groove M is formed in the insulating layer. After that, such upper-layer structures as the thin-film transistor layer 4 and the light-emitting-element layer 5 may be sequentially formed on the insulating layer.

As can be seen, this embodiment can achieve similar advantageous effects as those of the first embodiment.

Modification

Figure 10:
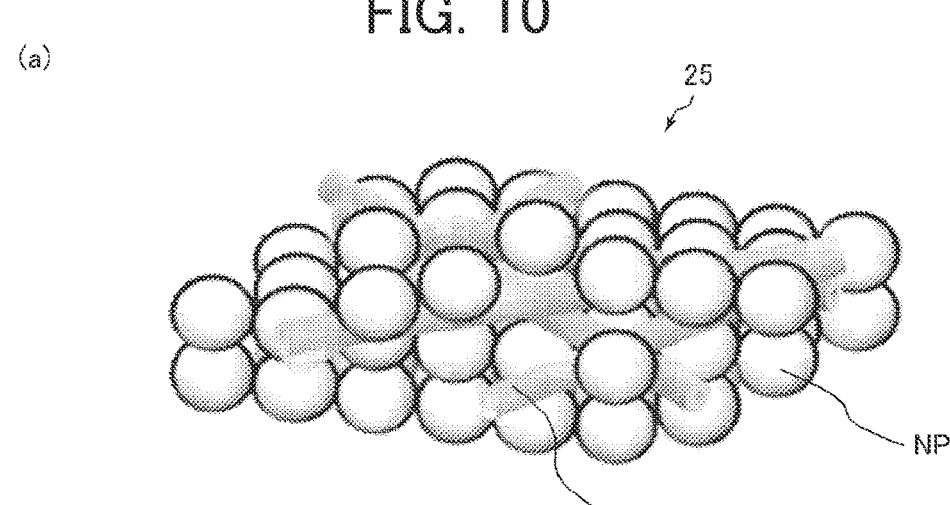
FIG. 10 illustrates an essential configuration of a modification of the display device illustrated in FIG. 9.
Figure 10:
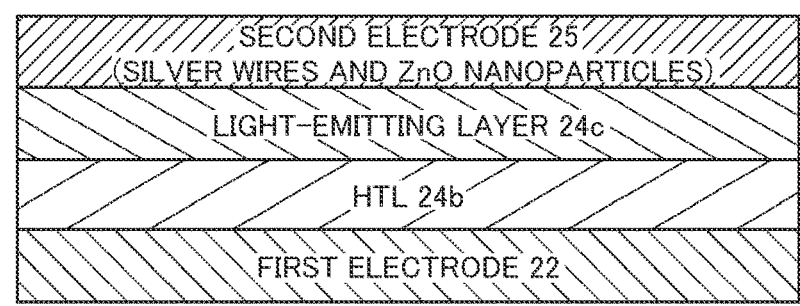
Figure 10:
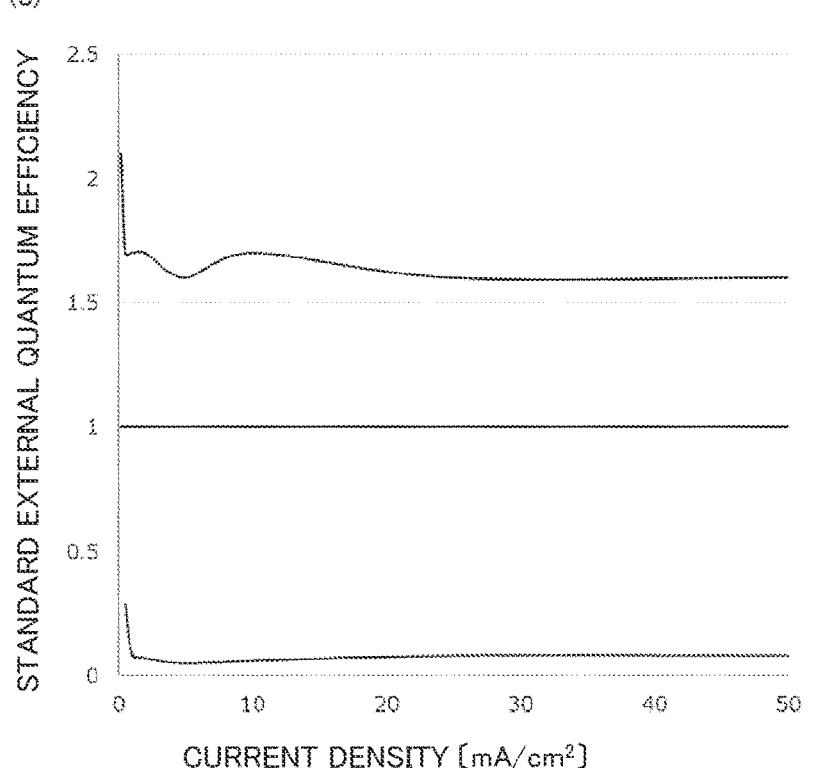

FIG. 10 illustrates an essential configuration of a modification of the display device illustrated in FIG. 9. FIG. 10(a) is a perspective view of a specific configuration of the second electrode in the modification. FIG. 10(b) is a drawing illustrating a specific configuration of a light-emitting-element layer in the modification. FIG. 10(c) is a graph showing an advantageous effect of the modification.

In the drawings, a main difference between this modification and the second embodiment is that, in the modification, the second electrode 25 includes an electron-injection layer and an electron-transport layer. Note that like reference signs denote common constituent features between this modification and the second embodiment. Such constituent features will not be elaborated upon here.

In the display device 2 of this modification, as illustrated in FIG. 10(a), the second electrode 25 contains, metal nanowires, for example, silver nanowires NW; and zinc oxide (ZnO) nanoparticles NP that are an electron-injection-layer material and an electron-transport material. That is, a silver-nanowire solution and a zinc-oxide-nanoparticle solution are mixed at a predetermined ratio and stirred. The mixture is applied (delivered in the form of droplets) and dried to form the second electrode 25 in which the silver nanowires NW and the zinc oxide nanoparticles NP are mixed together. Specifically, the silver nanowires NW are three-dimensionally arranged at random in interstitial spaces between the zinc oxide nanoparticles NP (having an average particle size of 1 to 30 nm).

Moreover, as illustrated in FIG. 10(b), the display device 2 of this modification includes: the first electrode 22 (the anode); the HTL layer (the hole-transport layer) 24b; the light-emitting layer 24c (e.g. the quantum-dot light-emitting layer), and the second electrode (the common cathode) 25 including the electron-injection layer and the electron-transport layer, all of which are provided in the stated order.

Furthermore, the configuration in FIG. 10(a) shows that, in the second electrode 25, an area of contact increases between the silver nanowires NW and the zinc oxide nanoparticles serving as an electron-transport material. Hence, as FIG. 10(c) shows, within a current density range of 0 to 50 (mA/cm$^2$), an external quantum efficiency UB (a standard value with respect to a reference value) of a light-emitting element X in this modification 2 exhibits a significant increase compared with the configuration in FIG. 3; that is, an external quantum efficiency UA (a reference value of each of the current densities=1) of a light-emitting element X in which the second electrode 25 is formed on the electron-injection layer (the zinc oxide nanoparticle layer) 24e, and with a standard external quantum efficiency Ua (a standard value with respect to a reference value) of a light-emitting element having a cathode made of a typical silver thin film.

Furthermore, compared with a case where the electron-transport layer 24d, the electron-injection layer 24e, and the second electrode (the common cathode) 25 are formed at separate steps, the configuration in FIG. 10(a) can reduce the number of steps.

In addition, excessive metal nanowires NW deteriorate capability to transport electrons to the light-emitting layer 24c, and insufficient metal nanowires NW increase the resistance value. Hence, a volume ratio of the metal nanowires NW to the ZnO nanoparticles NP ranges 1/49 to 1/9.

As can be seen, this modification can achieve similar advantageous effects as those of the second embodiment.

Third Embodiment

Figure 11:
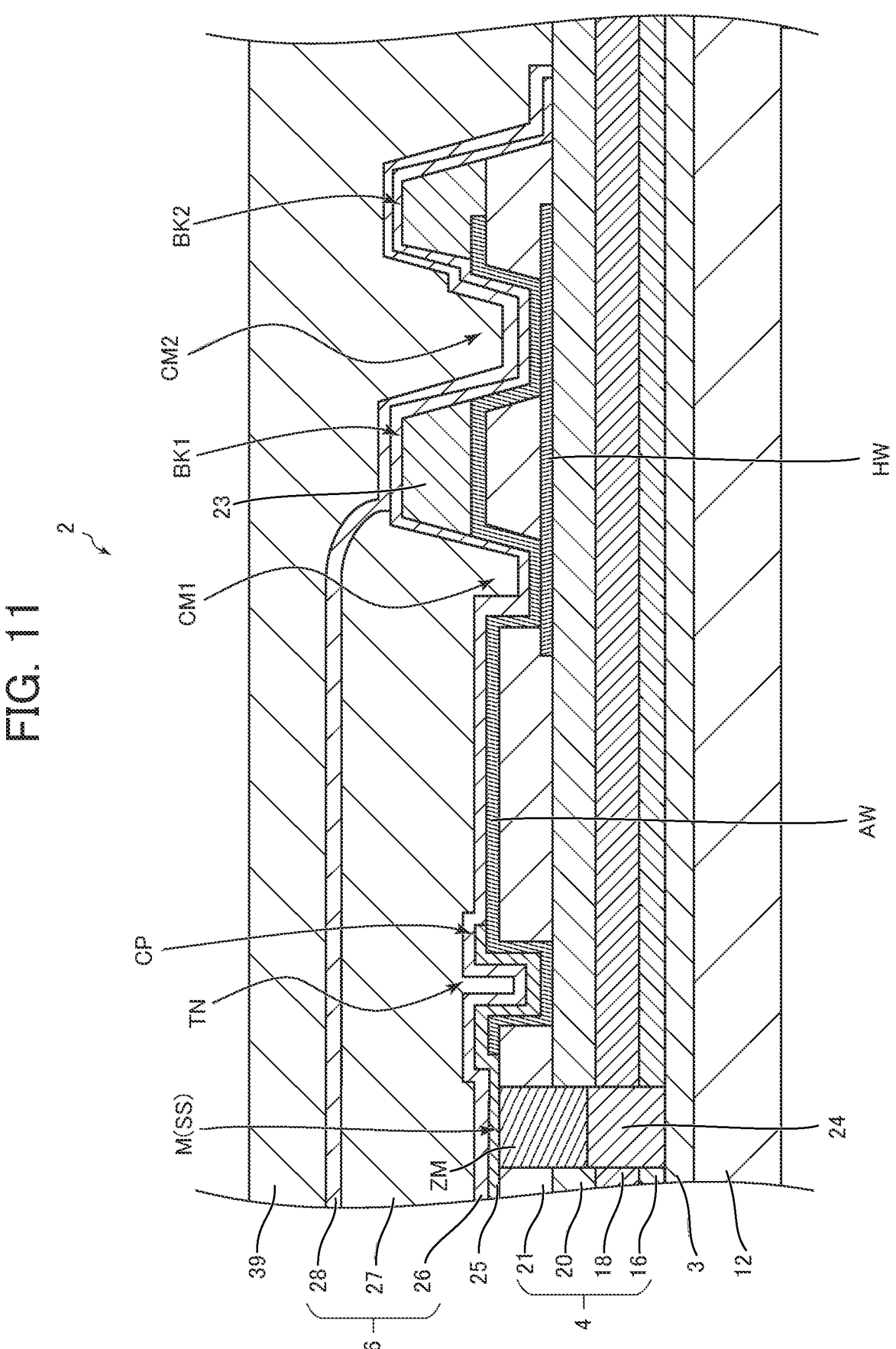
FIG. 11 is a cross-sectional view of an essential configuration of a display device according to a third embodiment of the disclosure.

FIG. 11 is a cross-sectional view of an essential configuration of a display device according to a third embodiment of the disclosure. A main difference between this embodiment and the second embodiment is that the functional layer and an insulating material provided on the functional layer fill an interior of the groove. Note that like reference signs denote common constituent features between this embodiment and the second embodiment. Such constituent features will not be elaborated upon here.

FIG. 11 shows that, in the display device 2 of this embodiment, the groove M serving as the block structure SS has an interior filled with the functional layer 24 and an insulating material ZM provided on the functional layer 24. This insulating material ZM has an upper surface provided in the interior of the groove M, so that the upper surface of the insulating material ZM is flush with an upper surface of the planarization film 21. This feature can readily prevent such a problem as an irregular step to be created on the second electrode 25, when the second electrode 25 is formed on the insulating material ZM. Note that, the statement "flush" means that a value of the irregularity between the upper surfaces of the insulating material ZM and the planarization film 21 is set within a range of, for example, 0 to 500 nm.

Moreover, the insulating material ZM and the planarization film 21 are formed of for example, the same material. As can be seen, if the insulating material ZM and the planarization film 21 are formed of the same material, a junction is enhanced between the planarization films 21 divided by the groove M and the insulating material ZM. In addition, the upper surfaces of the insulating material ZM and the planarization film 21 are further flush with each other more easily, making it possible to readily prevent creation of an irregular step on the second electrode 25.

Furthermore, the insulating material ZM may be formed of far example, an inorganic insulating-film material. Hence, if the insulating material ZM is formed of an inorganic insulating-film material, the insulating material ZM can prevent such a foreign substance as water from infiltrating into the planarization film 21, making it possible to reduce deterioration of the light-emitting elements X. In addition, if the insulating material ZM made of an inorganic insulating-film material is completely interposed between the planarization films 21 divided by the groove M, the insulating material ZM can block water from infiltrating into the planarization film 21 toward the light-emitting elements X. Such a feature can omit the trench TN.

Figure 12:
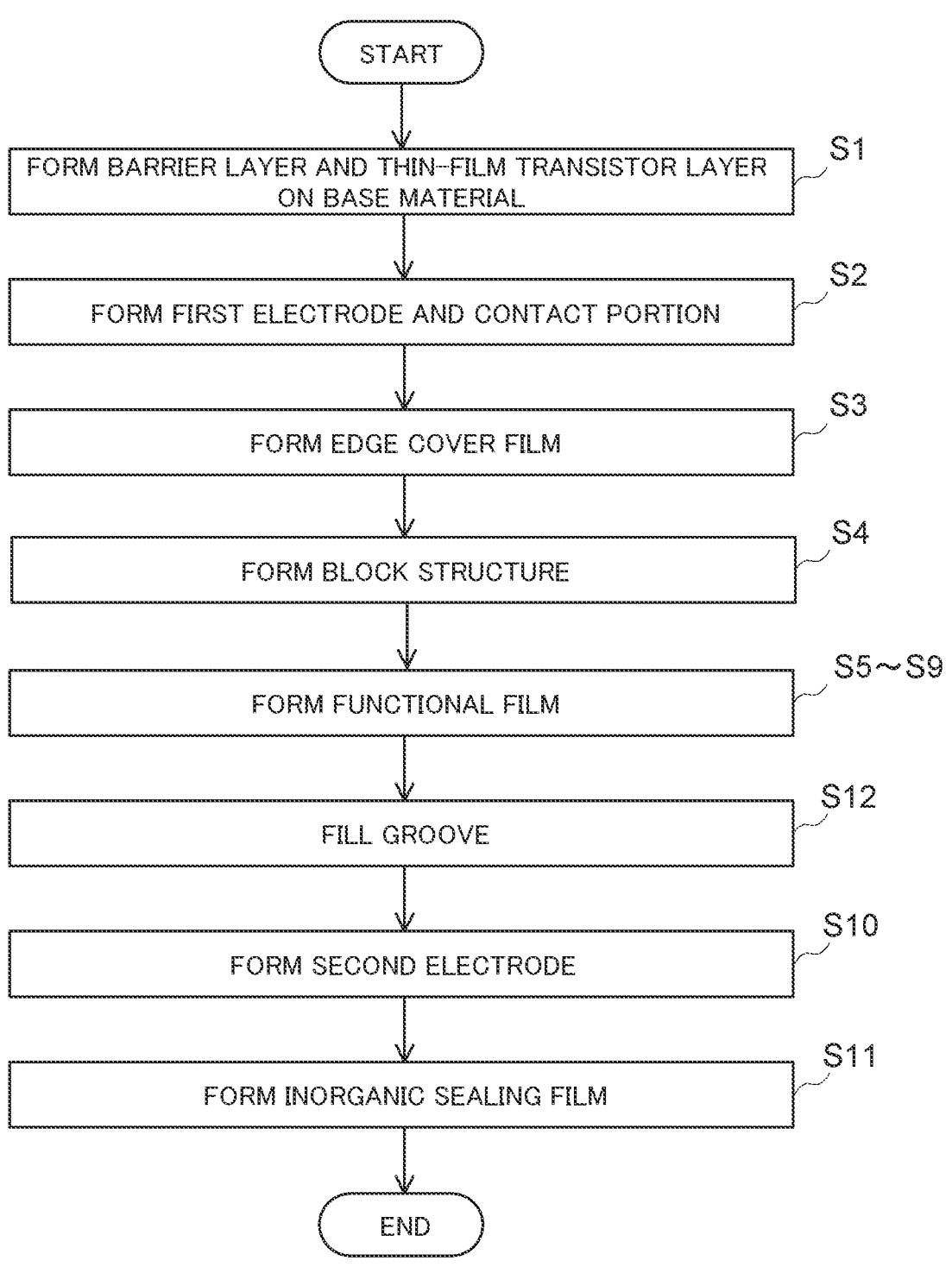
FIG. 12 is a flowchart showing a method for producing the display device illustrated in FIG. 11.

Here, also with reference to FIG. 12, a method for producing the display device 2 of this embodiment is specifically described. FIG. 12 is a flowchart showing a method for producing the display device illustrated in FIG. 11.

As shown at Step S4 of FIG. 12, a block structure forming step is carried out. After that, each of the layers in the functional layer 24 is formed (Steps S5 to S9) Then, a groove filling step is carried out to fill both the groove M and the functional layer 24 with the insulating material ZM to be supplied onto the functional layer 24 formed in the interior of the groove M (Step S12). After that, as seen in the first embodiment, Steps S10 and S11 are sequentially carried out.

As can be seen, this embodiment can achieve similar advantageous effects as those of the first embodiment.

Fourth Embodiment

Figure 13:
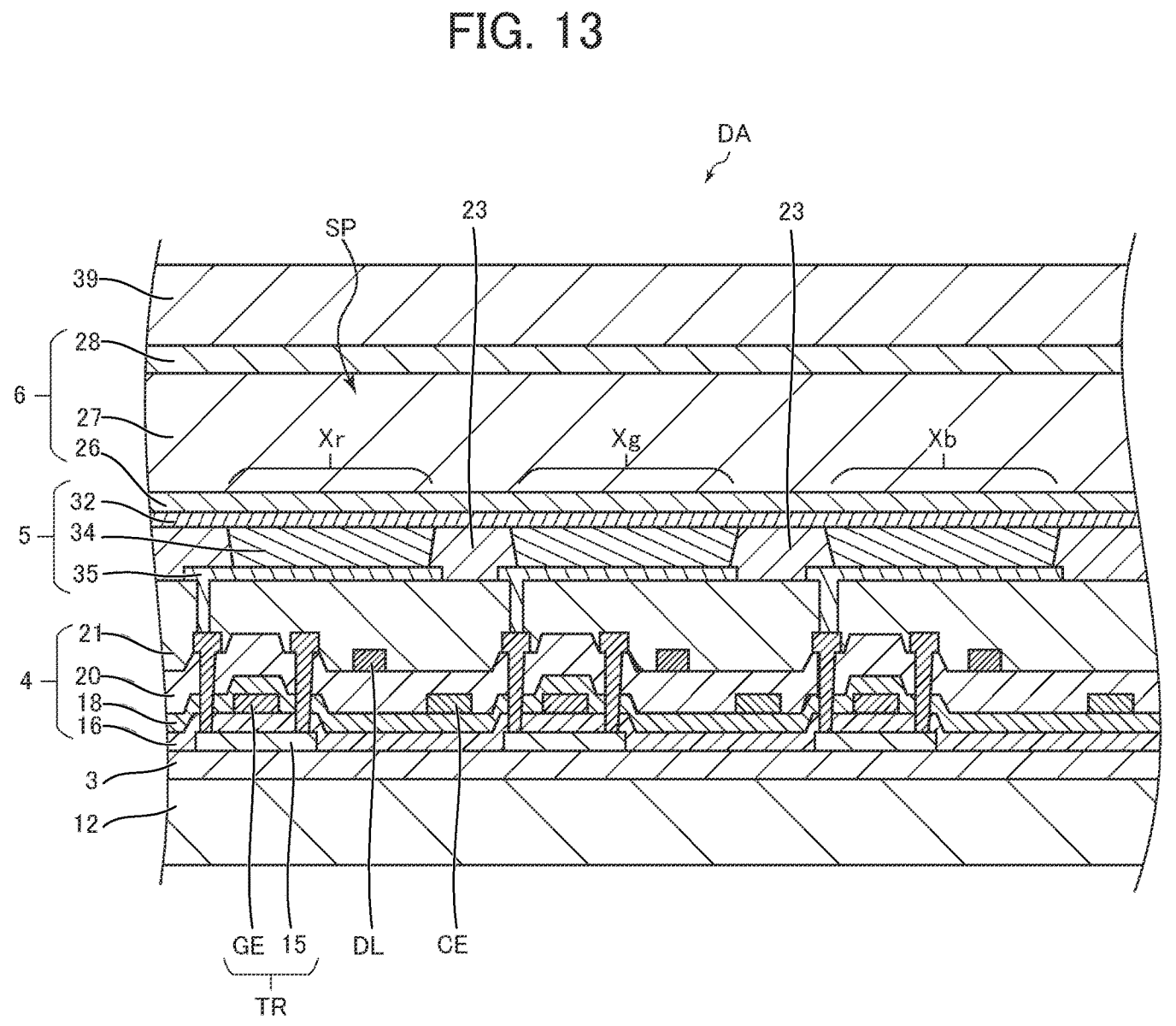
Figure 14:
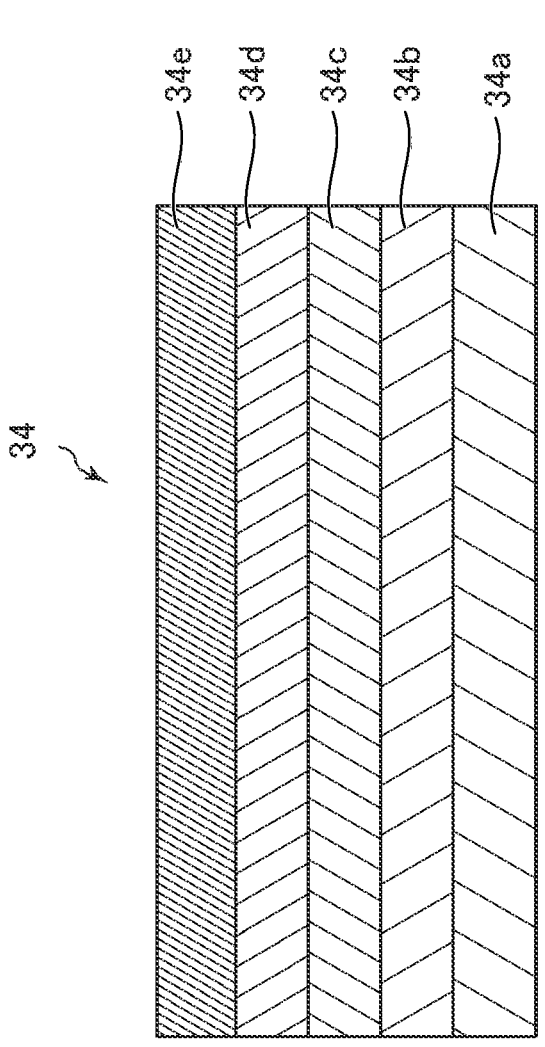
FIG. 14 is a cross-sectional view of a specific configuration of a functional layer illustrated in FIG. 13.
Figure 15:
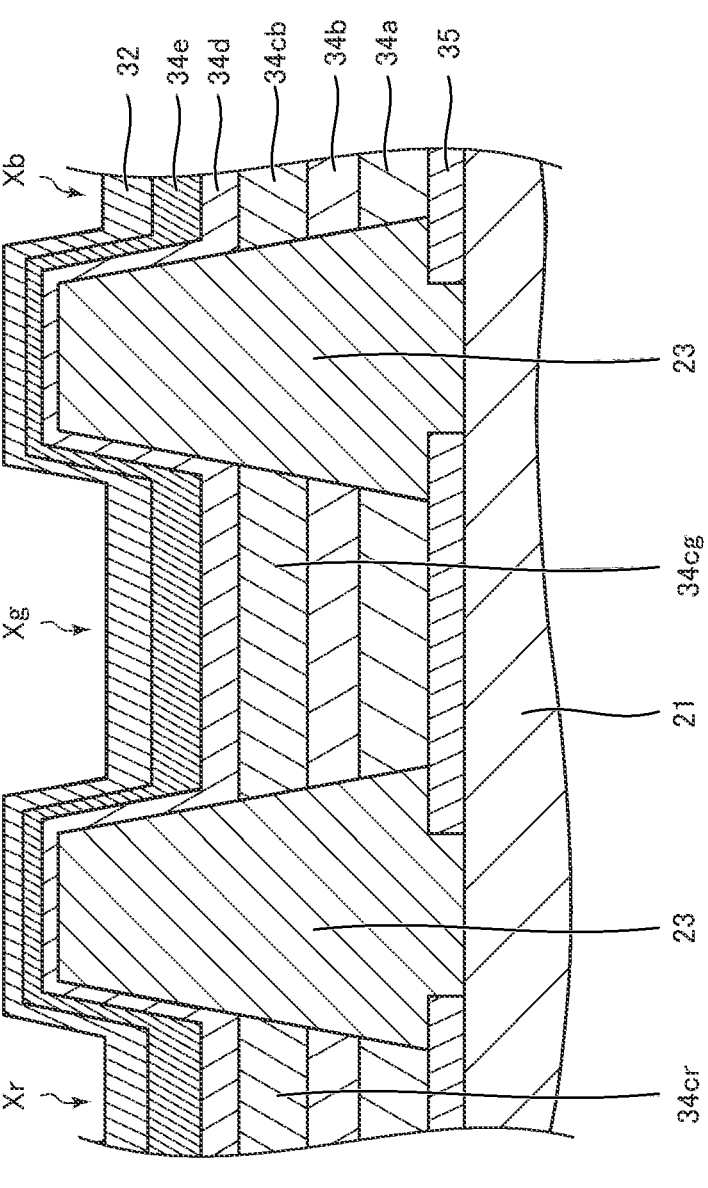
FIG. 15 is a cross-sectional view of a specific exemplary configuration of light-emitting elements illustrated in FIG. 13.

FIG. 13 is a cross-sectional view of an essential configuration of a display device according to a fourth embodiment of the disclosure. FIG. 14 is a cross-sectional view of a specific configuration of a functional layer illustrated in FIG. 13. FIG. 15 is a cross-sectional view of a specific exemplary configuration of light-emitting elements illustrated in FIG. 13.

In the drawings, a main difference between this embodiment and the first embodiment is that this embodiment presents an inverted structure including: a first electrode 35 serving as a cathode; a functional layer 34; and a second electrode 32 serving as an anode, all of which are provided in the stated order from toward the thin-film transistor layer 4. Note that like reference signs denote common constituent features between this embodiment and the first embodiment. Such constituent features will not be elaborated upon here.

In the display device 2 of this embodiment, as illustrated in FIG. 13, each of the light-emitting elements Xr, Xg, and Xb includes: the first electrode (the cathode) 35; the functional layer 34; and the second electrode (the anode) 32 sequentially provided on the thin-film transistor layer 4. Moreover, as illustrated in FIG. 14, the functional layer 34 includes: an electron-injection layer 34a, an electron-transport layer 34b; a light-emitting layer 34c; a hole-transport layer 34d; and a hole-injection layer 34e, all of which are stacked on top of another in the stated order from below.

Moreover, as illustrated in FIG. 15, the display device 2 of this embodiment has the light-emitting elements Xr, Xg, and Xb separated from one another by the edge cover film 23 serving as a bank. For each of the light-emitting elements X, the first electrode 35, the electron-injection layer 34a, the electron-transport layer 34b, and light-emitting layers 34cr, 34cg, and 34cb (collectively referred to as the light-emitting layer 34c) are provided in shapes of islands. Furthermore, the light-emitting elements X are provided with the hole-transport layer 34d, the hole-injection layer 34e, and the second electrode 32, each of which is shaped monolithically in common among ail the sub-pixels SP.

As can be seen, this embodiment can achieve similar advantageous effects as those of the first embodiment.

Modification

Figure 16:
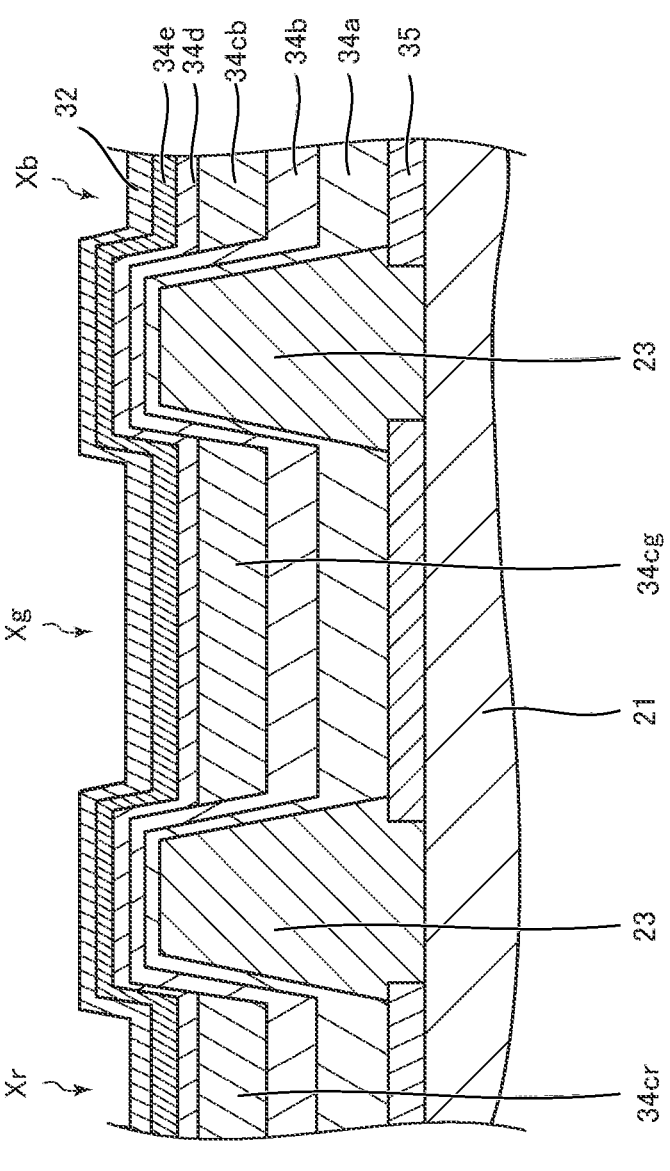
FIG. 16 is a cross-sectional view of a modification of the display device illustrated in FIG. 13.

FIG. 16 is a cross-sectional view of a modification of the display device illustrated in FIG. 13.

In the drawing, a main difference between this modification and the fourth embodiment is that, in the modification, the electron-injection layer 34a and the electron-transport layer 34b are provided as common layers in common among all the sub-pixels. Note that like reference signs denote common constituent features between this modification and the fourth embodiment. Such constituent features will not be elaborated upon here.

In the display device 2 of this modification, as illustrated in FIG. 16, the electron-injection layer 34a and the electron-transport layer 34b are formed monolithically in common among the light-emitting elements Xr, Xg, and Xb. That is, each of the electron-injection layer 34a and the electron-transport layer 34b can be formed not only by the ink-jet printing described in the fourth embodiment, but also by delivering droplets such as spin-coating.

As can be seen, this modification can achieve similar advantageous effects as those of the fourth embodiment. Moreover, the electron-injection layer 34a and the electron-transport layer 34b are formed as common layers, such that the production step of the display device 2 can be simplified.

Note that, other than the above description, each of the embodiments and modifications may be combined appropriately.

INDUSTRIAL APPLICABILITY

The disclosure is useful for a display device and a display device production method that can prevent the display performance from deteriorating even if the functional layer is formed by delivering droplets.

The invention claimed is:

1. A display device including a display region having a plurality of sub-pixels, and a frame region surrounding the display region, the display device comprising:
   a base material;
   a thin-film transistor layer provided on the base material;

a light-emitting-element layer provided on the thin-film transistor layer, and including a plurality of light-emitting elements, each including a first electrode, a functional layer, and a second electrode, the plurality of light-emitting elements being formed to emit lights in different colors;

a contact portion provided to the frame region, and electrically connecting a terminal unit provided to the frame region and the second electrode to each other through a routed wire; and a block structure shaped into a frame and provided to the contact portion beside the display region, in order to block formation of the functional layer on the contact portion, wherein:

the block structure includes a groove formed in the thin-film transistor layer, and the groove has an interior filled with the functional layer and an insulating material provided on the functional layer.

2. The display device according to claim 1, wherein the contact portion is provided with a conductive film electrically connecting to the routed wire and the second electrode, the conductive film being formed in a same layer, and of a same material, as the first electrode.

3. The display device according to claim 1, wherein the block structure includes a bank protruding from the thin-film transistor layer.

4. The display device according to claim 3, wherein the bank has a protruding height determined in accordance with a volume of the functional layer.

5. The display device according to claim 1, wherein:

the thin-film transistor layer includes:

a plurality of inorganic insulating films; and a planarization film, wherein the planarization film is stacked on top of the plurality of inorganic insulating films, and the plurality of inorganic insulating films are stacked on top of the base material, and the groove is formed as a cutout in the planarization film and the plurality of inorganic insulating films.

6. The display device according to claim 5, wherein the insulating material has an upper surface flush with an upper surface of the planarization film.

7. The display device according to claim 5, wherein the insulating material and the planarization film are formed of a same material.

8. The display device according to claim 1, wherein the insulating material is formed of an inorganic insulating-film material.

9. The display device according to claim 1, wherein the groove has a volume determined in accordance with a volume of the functional layer.

10. The display device according to claim 1, wherein the thin-film transistor layer includes an organic insulating film formed as an uppermost layer, and the organic insulating film includes a trench formed to surround the block structure.

11. The display device according to claim 1, wherein:

the functional layer includes:

a charge-injection layer; and a charge-transport layer, and at least one of the charge-injection layer or the charge-transport layer is a common layer monolithically provided in common among the plurality of light-emitting elements.

12. The display device according to claim 11, wherein the light-emitting layer is a quantum-dot light-emitting layer containing quantum dots.

13. The display device according to claim 12, wherein the quantum-dot light-emitting layer includes: a red quantum-dot light-emitting layer configured to emit a red light; a green quantum-dot light-emitting layer configured to emit a green light; and a blue quantum-dot light-emitting layer configured to emit a blue light.

14. A display device production method for producing a display device including a display region having a plurality of sub-pixels, and a frame region surrounding the display region, the display device including:

a base material;

a thin-film transistor layer provided on the base material; and a light-emitting-element layer provided on the thin-film transistor layer, and including a plurality of light-emitting elements, each including a first electrode, a functional layer, and a second electrode, the plurality of light-emitting elements being formed to emit lights in different colors, the display device production method comprising:

forming the first electrode;

forming a contact portion in the frame region, the contact portion electrically connecting a terminal unit provided to the frame region and the second electrode to each other through a routed wire;

forming a block structure shaped into a frame and provided to the contact portion beside the display region, wherein:

the block structure blocks a formation of the functional layer on the contact portion, and the block structure is formed by cutting a groove out of the thin-film transistor layer; and after forming the block structure:

forming the functional layer; and filling both the groove and the functional layer with an insulating material to be supplied onto the functional layer formed in an interior of the groove.

15. The display device production method according to claim 14, wherein the block structure, is formed by a bank protruding from the thin-film transistor layer.

16. The display device production method according to claim 14, wherein, in forming the contact portion, a conductive film is formed in a same layer, and of a same material, as the first electrode, the conductive film electrically connecting to the routed wire and the second electrode.

* * * * *